United States Patent [19]

Bean et al.

[11] Patent Number: 5,091,767
[45] Date of Patent: Feb. 25, 1992

[54] ARTICLE COMPRISING A LATTICE-MISMATCHED SEMICONDUCTOR HETEROSTRUCTURE

[75] Inventors: John C. Bean, New Providence; Gregg S. Higashi, Basking Ridge; Robert Hull, South Orange, all of N.J.; Justin L. Peticolas, Wescosville, Pa.

[73] Assignee: AT&T Bell Laboratories, Murray Hill, N.J.

[21] Appl. No.: 671,276

[22] Filed: Mar. 18, 1991

[51] Int. Cl.⁵ .............................. H01L 29/04
[52] U.S. Cl. ......................... 357/60; 357/16; 357/30
[58] Field of Search ............ 357/60, 16, 55, 56, 357/30 B, 30 E, 30 K, 30 N, 30 R

[56] References Cited

U.S. PATENT DOCUMENTS 4,632,712 12/1986 Fan et al. .................. 357/60
4,872,046 10/1989 Morkoc et al. ............. 357/60
5,032,893 7/1991 Fitzgerald, Jr. et al. ........ 357/60

FOREIGN PATENT DOCUMENTS 2215514A 2/1989 United Kingdom .

Primary Examiner—Georgia Epps
Attorney, Agent, or Firm—Eugene E. Pacher

[57] ABSTRACT

Disclosed are strained layer heteroepitaxial structures (e.g., GeSi/Si) that can have low threading dislocation density as well as a substantially planar surface. Furthermore, a large fraction (e.g., >90%) of the total surface are of the structure can be available for device processing. These advantageous features are achieved through utilization of novel "dislocation sinks" on or in the substrate whose height parameter h is less than or about equal to the thickness of the strained heteroepitaxial layer on the substrate. Exemplarily, $h \geq h_c$, where $h_c$ is the critical thickness associated with misfit dislocation generation in the substrate/overlayer combination.

12 Claims, 3 Drawing Sheets ated direc- 65 tion [or in one of a small number (e.g., 2 or 3) of predetermined directions]. For instance, in overlayer materials that have the diamond cubic or the zincblende struc-
ARTICLE COMPRISING A LATTICE-MISMATCHED SEMICONDUCTOR HETEROSTRUCTURE

FIELD OF THE INVENTION

This invention pertains to articles that comprise a semiconductor heterostructure wherein the substrate lattice constant differs substantially from that of the epitaxial heterolayer that overlies the substrate.

BACKGROUND OF THE INVENTION

When an epitaxial semiconductor layer is grown upon a single crystal semiconductor substrate and there is a lattice parameter mismatch between the substrate material and the overlayer material and the overlayer thickness exceeds a critical thickness $h_c$, then "misfit" dislocations are typically produced in the overlayer material.

It is well known that a perfect dislocation cannot simply terminate in the bulk of a crystal but rather must terminate at a free surface, upon itself by forming a loop, or at a node with another dislocation. Thus, misfit dislocations generally have a portion that lies in (or close to) the deposit/substrate interface, and frequently also a portion (typically the two ends of the dislocation) that is inclined with respect to the interface, substantially spans the thickness of the deposit layer and ends at the free surface of the deposit. The former portion is referred to as an "interfacial" dislocation and the latter as a "threading" dislocation.

Semiconductor structures of the described type ("strained layer heterostructures") are of considerable device interest since they potentially make possible previously unattainable devices and/or combinations of devices. For example, availability of high quality GaAs on Si would permit the combination of Si VLSI circuits with high speed GaAs circuits or with GaAs optical components. However, despite the recognized potential advantages of devices and/or circuits formed in strained layer semiconductor heterostructures, in most materials their practical utility has been limited by high dislocation densities. In particular, a relatively high density of threading dislocations is highly detrimental to device performance.

Prior art techniques for reducing interfacial and threading dislocation densities include "patterned" or mesa growth. In mesa epitaxy the lateral extent of deposit regions is limited such that the probability of the presence of dislocation sources in any given deposit region is low, and/or such that dislocations which do form can reach the boundary of the deposit region either during growth or during a subsequent heat treatment. See, for instance, U.S. patent application Ser. No. 561,744, filed Aug. 2, 1990 for E. A. Fitzgerald.

Another example of patterned epitaxy is British patent application GB 2,215,514A, incorporated herein by reference. It involves forming a pattern of dislocation-termination features ("mesas", but allegedly "trenches" are also possible) on the substrate surface.

As is well known, at least in substantially all strained layer heteroepitaxial systems of current technological interest, the vast majority of misfit dislocations are not free to move in arbitrary directions. Instead the dislocations are constrained to move in a predetermined direction [or in one of a small number (e.g., 2 or 3) of predetermined directions]. For instance, in overlayer materials that have the diamond cubic or the zincblende structure, the dislocations can glide only along the [011] or [0$\bar{1}$1] interfacial direction if the substrate surface has (100) orientation.

The mesa growth technique can produce only relatively small, unconnected regions of epitaxial material on the substrate. The patterned epitaxy technique of GB 2,215,514A can overcome this particular shortcoming of the patterned growth technique, but has itself a significant shortcoming. In particular, the disclosed mesa geometry typically results in highly non-planar surfaces which can make subsequent metalization and/or other processing steps difficult. In general the technique of the '514A reference will result in material that may be ill-suited for IC processing or for the fabrication of optical and/or opto-electronic devices, especially large area devices such as photodetectors.

In view of the potential advantages of devices and combinations of devices that comprise strained layer semiconductor heterostructures, it would be highly desirable to have available such heterostructures that have low threading dislocation density and that are not subject to the above referred-to shortcomings of prior art patterned epitaxy heterostructures. This application discloses such heterostructures, together with techniques for making the heterostructures.

SUMMARY OF THE INVENTION

In a broad aspect the invention is an article that comprises a novel strained layer heteroepitaxial semiconductor body which has a substantially planar surface and comprises features (referred to herein as "dislocation sinks") for intercepting and eliminating threading dislocations.

More specifically, the article comprises a first semiconductor single crystal substrate having a major surface and comprising a multiplicity of spaced-apart features ("dislocation sinks") on or in the major surface, associated with a given dislocation sink being a dimension (h) normal to the major surface. The article further comprises a second semiconductor layer on the major surface and epitaxial with the substrate, with at least a portion of the semiconductor layer contacting at least some of the dislocation sinks. Associated with the first and second semiconductor materials are lattice constants $a_s$ and $a_d$, respectively, with $a_s \neq a_d$. Typically, $|a_s - a_d|/a_s \gtrsim 0.5\%$. Furthermore, with the second semiconductor layer is associated at least one dislocation slip direction and a minimum distance ($l_d$) of threading dislocation slip in the given dislocation slip direction. Significantly, the dislocation sinks are disposed such that in at least the portion of the second semiconductor layer that contacts the features substantially all points of the second semiconductor layer are within the distance $l_d$ of a dislocation sink, the distance measured along a slip direction. As a consequence of this placement of the features, dislocation movement during deposition of the second semiconductor layer results in termination of the dislocations at the dislocation sinks, with consequent elimination of the threading portions of the misfit dislocations. Furthermore, the layer thickness t and the sink dimension h are selected such that h is less than or approximately equal to t the layer surface is substantially planar.

In a particular exemplary embodiment of the invention the dislocation sinks are small regions of $SiO_2$ or other third material (e.g., $Si_3N_4$), e.g., of pill box-shape, with diameter of ~2 μm and height substantially less than the deposit thickness. However, a dislocation sink can be a recessed feature etched into the substrate surface, or it can be a region of amorphous substrate material (produced typically by ion implantation). Dislocation sinks need not have circular cross-section. At least in some circumstances it is advantageous if the cross section is polygonal (e.g., trigonal or quadrilateral), with one or more sides aligned with appropriate crystallographic directions in the substrate.

DETAILED DESCRIPTION OF SOME PREFERRED EMBODIMENTS

Figure 1:
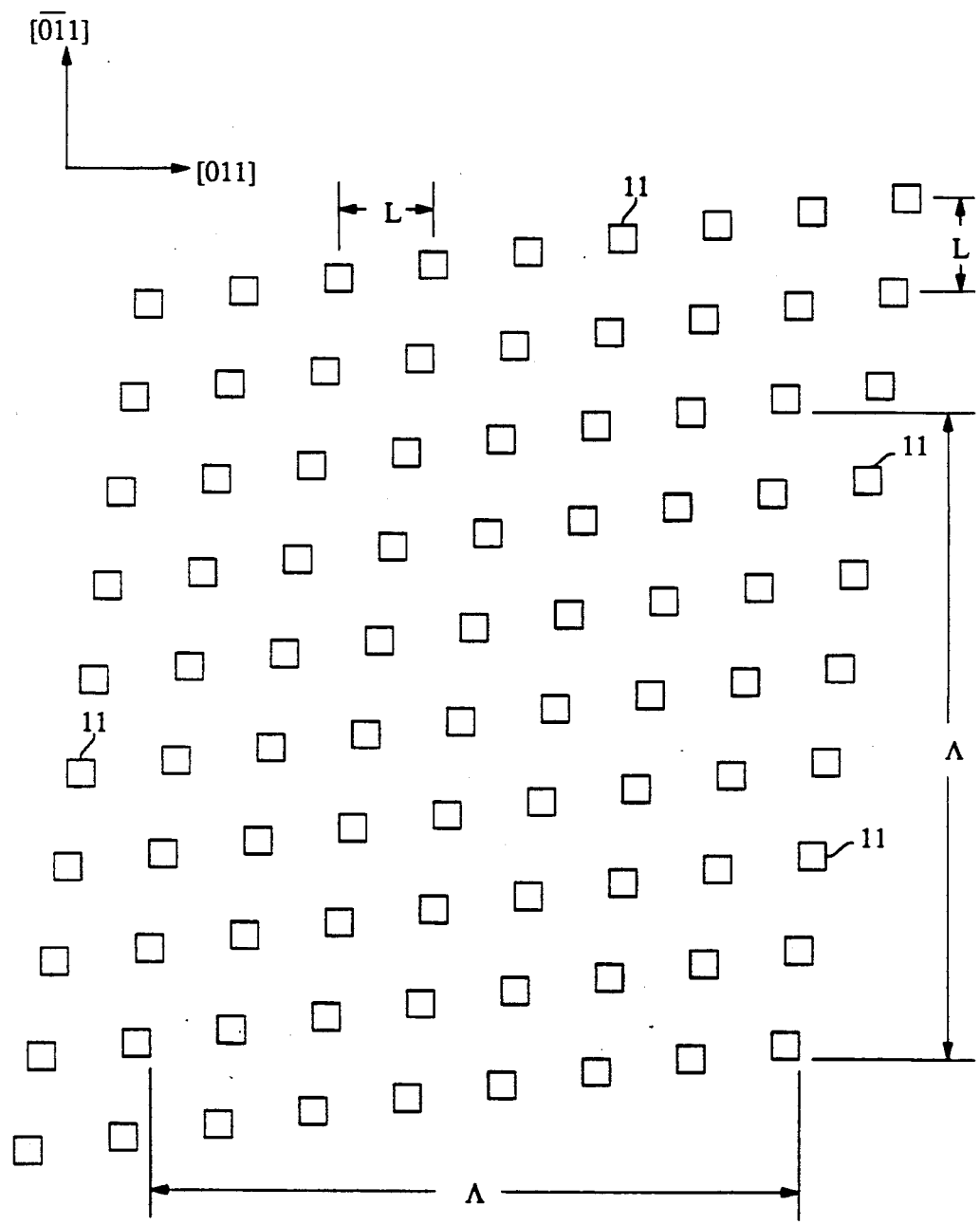
FIG. 1 schematically depicts an exemplary array of dislocation sinks.

A simple dislocation sink pattern is shown schematically in plan view in FIG. 1. The figure depicts a portion of the top surface of a substrate, with an array of dislocation sinks 11 disposed such that any misfit dislocation that moves in the heteroepitaxial layer (not shown) in one of the allowed directions can travel at most a distance A before it is intercepted by a dislocation sink. Indicated in FIG. 1 are also the [011] and [0$\bar{1}$1] directions which are [assuming the substrate has (100) interfacial orientation] the directions of dislocation motion.

As those skilled in the art will appreciate, it is readily possible to associate a typical minimum distance of threading dislocation movement with a given substrate/overlayer combination and a given set of growth and processing parameters. By this minimum distance ($l_d$) associated with a given strained layer heteroepitaxial semiconductor body, we mean herein that slip distance which, under the relevant growth conditions, is exceeded by at least 90% (preferably 99% or more) of all threading dislocations in the semiconductor body. Exemplarily, for a (100)-oriented $Ge_{1-x}Si_x/Si$ (x~0.15–0.20) strained layer heteroepitaxial body having a layer thickness of 0.1 μm, grown by MBE at 600° C. at 0.3 nm/s, $l_d$~100 μm for uninterrupted growth. However, this distance can be substantially larger (as much as orders of magnitude) if the growth and processing conditions comprise growth or annealing at higher temperature in, or outside of, the growth chamber. In general, a minor amount of experimentation will suffice to determine $l_d$.

In FIG. 1 the dislocation sinks are shown disposed in a regular array. Although generally desirable, this is not an essential feature of the invention. In the regular array the sink centers are spaced a distance L apart, with adjacent sinks staggered slightly with respect to the directions of possible dislocation motion. It will be evident to those skilled in the art that A depends on L, the sink dimensions, and the offset between adjacent sinks. For any particular set of these parameters it is a simple matter to determine A. For instance, if the sinks have 2 μm diameter (or are 2 μm on side, as shown), with L=10 μm, and offset of 1 μm, then A=100 μm. Thus, if processing of a heterostructure that comprises such an array of dislocation sinks is carried out under conditions such that the minimum distance ($l_d$) of threading dislocation slip on a dislocation slip plane is ≧100 μm, then substantially all threading dislocations will be intercepted by a sink.

Exemplarily the sinks are pill box-shaped bodies of $SiO_2$ (or other appropriate material such as $Si_3N_4$), defined by standard lithographic techniques. These sinks thus consist of amorphous material. If a dislocation is intercepted by such a sink, then the threading dislocation arm is annihilated at the amorphous/crystalline interface.

In the above-described particular case the deposit forms a continuous layer that covers about 95% of the substrate area. The advantage of such a heterostructure over one produced by the prior art mesa-technique is immediately apparent.

Figure 2:
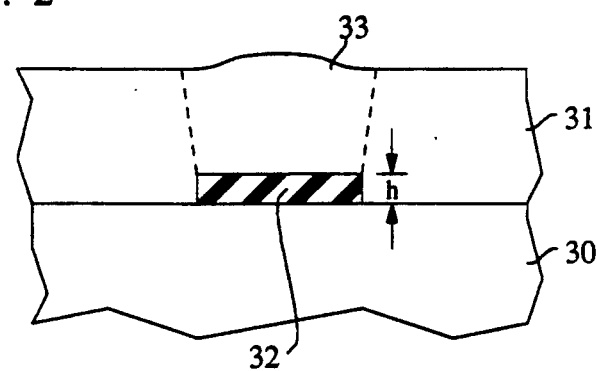
FIGS. 2–4 schematically illustrate exemplary dislocation sinks that comprise material deposited on the substrate.

A significant aspect of the invention is the nature of the dislocation sinks, with a dimension (h) of the sinks normal to the substrate surface being a significant parameter. FIG. 2 schematically depicts a relevant portion of a strained layer heteroepitaxial structure according to the invention, wherein numeral 30 designates the substrate, 31 the epitaxial overlayer, 32 a dislocation sink (e.g., a $SiO_2$ "pill box" of height h), and 33 a (typically polycrystalline) region of overlayer material disposed on the dislocation sink. The dimension h is selected such that, under the applicable growth and processing conditions, substantially all (>90%) of dislocation generation and motion (collectively "layer relaxation") occurs before the overlayer thickness reaches the value h. Exemplarily, h is greater than about 10 $h_c$. For instance, for $Ge_xSi_{1-x}/Si$ (x such that $|a_s-a_d|/a_s \sim 1\%$), $h_c \sim 20$ nm. In this specific case, h≳0.2 μm (but h less than, preferably much less than, the layer thickness t; in this context, "much less than" typically means "less than 25%").

It will be appreciated that the embodiment of FIG. 2 exhibits a substantially planar layer surface. By "substantially planar" we mean herein that deviations in surface level that are associated with the dislocation sink are at most about h. It will also be appreciated that the presence of polycrystalline material 33 is not a significant disadvantage, since such regions typically constitute only a very small fraction of the total layer area, and since the polycrystalline nature will not generally adversely affect subsequent device or circuit processing.

Figure 3:
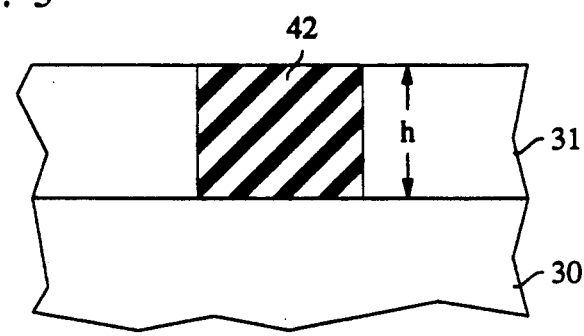

The embodiment of FIG. 2 clearly is produced by a non-selective deposition process such as MBE. On the other hand, the embodiment of FIG. 3 is produced by a selective deposition process such as can be achieved by CVD. In such a process overlayer material is deposited on the exposed substrate surface but substantially no overlayer material is directly deposited on the material (e.g., $SiO_2$) that constitutes the dislocation sink. In the exemplary embodiment of FIG. 3 the height h of the dislocation sink and the layer thickness t desirably are approximately equal, such that a substantially planar surface results.

Figure 4:
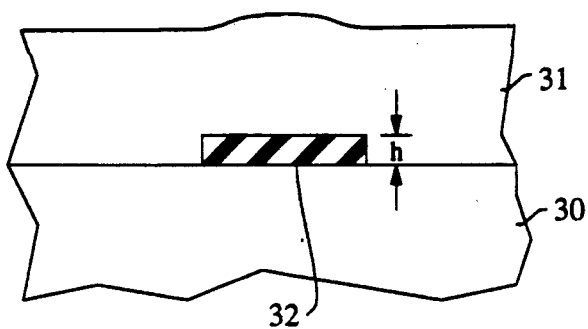

The embodiment of FIG. 4 differs from that of FIG. 2 in the use of a selective deposition process instead of a non-selective one. Since the lateral dimensions of the dislocation sinks typically are relatively small, lateral growth of overlayer material can result in overgrowth of sink 32 if sink height h is substantially less than the layer thickness t. The overgrowth material typically is single crystal epitaxial material, and the resulting layer surface can be substantially planar.

Figure 5:
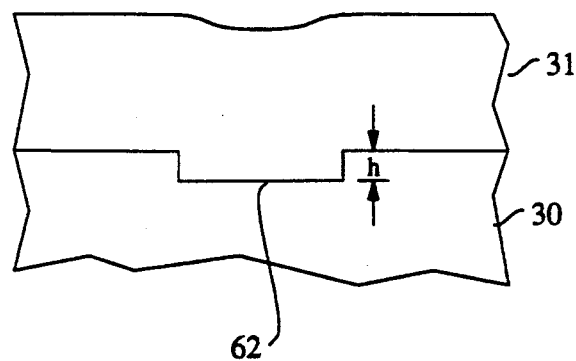
FIG. 5 schematically shows an exemplary dislocation sink that comprises a depressed feature in the substrate surface.

As indicated above, dislocation sinks according to the invention need not comprise third material (e.g., $SiO_2$ or $Si_3N_4$) deposited on the substrate surface, and FIG. 5 schematically depicts an exemplary embodiment wherein the dislocation sink comprises a recessed feature ("trench") 62 in the substrate surface. The dimension h is again selected such substantially all layer relaxation occurs before the overlayer thickness reaches the value h, as discussed above. Embodiments according to FIG. 5 can be made by non-selective as well as selective growth processes.

Figure 6:
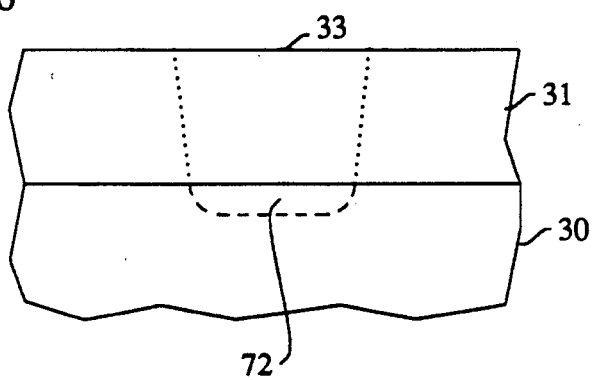
FIGS. 6 and 7 schematically depict exemplary dislocation sinks that comprise an amorphized region in the substrate.
Figure 7:
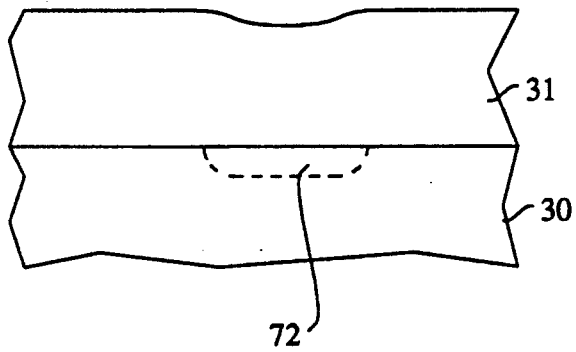

Further exemplary embodiments of the invention are schematically depicted in FIGS. 6 and 7, wherein numeral 72 designates an amorphized region of the substrate that serves as a dislocation sink. Exemplarily, the amorphized region is formed by means of ion implantation. It will be appreciated that the depth of region 72 is not a significant parameter, that typically the substrate surface is essentially planar, and that therefore h is essentially zero in these embodiments of the invention.

The embodiment of FIG. 6 is produced by means of a non-selective deposition process, and region 33 typically comprises polycrystalline overlayer material. On the other hand, the embodiment of FIG. 7 is produced by means of a selective deposition process and involves lateral growth of overlayer material over the amorphized region 72.

Those skilled in the art will appreciate that all three of the above discussed types of dislocation sinks (third material bodies on the substrate surface, trenches in the substrate, and amorphized regions in the substrate) can readily be formed by known techniques, and that deposition of the overlayer material can also be by known techniques.

Practice of the invention is not limited to the GeSi/Si system. In general, the invention can be used in the growth of any strained layer heteroepitaxial system. Among such systems of current technological interest are InGaAs/GaAs, GaAs/Si, InP/GaAs, and InP/Si. The growth of II/VI semiconductor layers is also contemplated. Furthermore, the strained layer need not be of uniform composition, and layers having graded compositions as well as layers that comprise a superlattice structure are contemplated.

Although an article according to the invention can be a semiconductor wafer with a strained heteroepitaxial layer thereon, in many cases the article will be a semiconductor body that comprises one or more devices (electronic devices such as transistors, opto-electronic devices such as lasers or photodetectors, and/or optical devices such as optical switches). Such devices can be conventional and do not need discussion. In view of the increase, continuity and planarity of overlayer area in inventive heterostructures, as compared to analogous prior art structures, layout of multidevice circuits is substantially simplified, and the achievable number of devices per unit substrate area is substantially increased, all as compared to analogous prior art heterostructures, with a concomitant potential increase in circuit speed due to reduction in the length of device interconnects.

EXAMPLE 1

On a (100)-oriented Si substrate was formed an array of $SiO_2$ pill boxes using standard oxidation, lithography and dry etching. The geometry of the array was substantially as shown in FIG. 1. The $SiO_2$ layer was 800 nm thick, the pill boxes were about 2 $\mu$m in diameter, with center-to-center spacing of 10 $\mu$m, with 1 $\mu$m offset. After cleaning of the surface by a conventional procedure, a 50 nm thick layer of Si was deposited by MBE at 750° C. and 0.3 nm/s, followed by deposition of 5 nm of Si at 550° C. This was followed by deposition of about 500 nm of $Ge_{0.15}Si_{0.85}$ by MBE at 550° C. and about 0.3 nm/s. The resulting strained heteroepitaxial layer was examined by transmission electron microscopy and found to have a threading dislocation density in the range $10^5/cm^2$, which is about an order of magnitude less than densities observed in unpatterned layers produced under comparable growth conditions.

EXAMPLE 2

A heteroepitaxial GeSi layer was produced substantially as in Example 1, except that the thickness of the GeSi layer was about 2.5 $\mu$m. The deviation from surface planarity was substantially less than 800 nm.

EXAMPLE 3

A heteroepitaxial GeSi layer is produced substantially as in Example 1, except that the oxide layer is 1 $\mu$m thick, the layers are deposited by a rapid thermal CVD (RTCVD) technique at 900° C. and approximately 1.5 nm/s, and the GeSi layer thickness is about 0.9 $\mu$m. The resulting surface is essentially planar.

EXAMPLE 4

A heteroepitaxial GeSi layer was produced substantially as in Example 1, except that the layers were deposited by RTCVD at 900° C. and about 1.5 nm/s, the oxide layer was 400 nm, and the GeSi layer thickness was about 3 $\mu$m. The GeSi material overlying the pill boxes was single crystalline, and the surface was substantially planar.

EXAMPLE 5

A Si (100) surface is patterned by conventional means to form an array of 400 nm thick square (2 $\mu$m side) depressions, to be referred to as "trenches". The geometry of the array is substantially as shown in FIG. 1. Onto the thus patterned surface is deposited by MBE a 100 nm Si buffer layer, followed by deposition (also by MBE, 600° C.) of 300 nm of $Ge_{0.15}Si_{0.85}$ material. The sample is annealed in situ for 10 minutes at 750° C. Subsequently, a 1 $\mu$m thick layer of $Ge_{0.15}Si_{0.85}$ is deposited by MBE at 550° C. The resulting GeSi layer is single crystal throughout, with a substantially planar surface.

EXAMPLE 6

An array of amorphized regions (1 $\mu$m square) is created in Si (100) by Si ion implantation (30 kV, $1 \times 10^{15} cm^{-2}$, 77K). The array geometry is substantially as shown in FIG. 1. On the thus prepared surface is grown a 100 nm thick Si layer by MBE at 650° C., followed by deposition of a 1 $\mu$m layer of $Ge_{0.25}Si_{0.75}$ by MBE at 550° C. The thus produced GeSi layer is single crystalline except for the regions that overlie the amorphized regions, which are polycrystalline. The surface of the GeSi layer is essentially planar.

EXAMPLE 7

A substantially planar GeSi layer is produced substantially as described in Example 6 except that the buffer and the GeSi layer are deposited by RTCVD at 900° C. The resulting GeSi layer is single crystal throughout.

EXAMPLE 8

A GeSi layer is produced as described in Example 1. The thus produced layer is annealed in situ at 800° C. for 20 minutes.

EXAMPLE 9

A GeSi layer is produced as described in Example 8, except that the sample is removed from the growth chamber prior to annealing, and annealing is accomplished by RTA (rapid thermal anneal) at 800° C. for 5 minutes in an inert atmosphere.

EXAMPLE 10

On a Si surface, misoriented 4° from (100) towards a [011] azimuth, is formed an array of $SiO_2$ pill boxes substantially as described in Example 1. A 100 nm thick layer of GaAs is deposited by conventional MBE at 400° C., followed by deposition of 90 nm of GaAs at 600° C. Onto the resulting GaAs layer is deposited at 550° C. a multilayer structure consisting of 10 layer pairs (20 nm $In_{0.2}Ga_{0.8}As$/100 nm GaAs), followed by deposition of 1 μm of GaAs at 600° C. The resulting sample has a substantially planar surface, with polycrystalline material overlying the pill boxes.

EXAMPLE 11

An array of pill boxes on a misoriented Si (100) surface is formed as described in Example 10. A 100 nm thick layer of GaAs is deposited by MBE at 600° C., followed by deposition of a linearly graded 0.5 μm thick $In_xGa_{1-x}As$ (x varying from 0 to 0.2) layer. The temperature was ramped during the deposition from 600° C. to 550° C. Onto the thus produced sample was deposited a 1 μm thick layer of $In_{0.2}Ga_{0.8}As$ at 500° C. by MBE. The resulting sample has a substantially planar surface, with polycrystalline material overlying the pill boxes.

We claim:

1. An article comprising a semiconductor body comprising
   a) a first semiconductor single crystal substrate having a major surface and comprising a multiplicity of spaced-apart features (to be termed "dislocation sinks") on or in the substrate, associated with a given dislocation sink being a dimension (h) normal to the major surface;
   b) a second semiconductor layer of nominal thickness t on the major surface and epitaxial with the first semiconductor substrate, with at least a portion of the second semiconductor layer contacting at least some of the dislocation sinks;
   c) associated with the first and second semiconductor materials being lattice constants $a_s$ and $a_d$, respectively, with $a_s$ differing from $a_d$; and
   d) associated with the second semiconductor layer being one or more dislocation slip directions and a minimum distance of threading dislocation slip in a dislocation slip direction (said distance designated $l_d$);

CHARACTERIZED IN THAT
   e) the dislocation sinks are disposed such that in the at least a portion of the second semiconductor layer that contacts dislocation sinks substantially all points of the second semiconductor layer are within the distance $l_d$ of a dislocation sink, the distance measured along a slip direction; and
   f) the layer thickness t and the sink dimension h are selected such that h is less than or approximately equal to t, and the layer surface is substantially planar.

2. An article according to claim 1, wherein a given dislocation sink comprises a third material body disposed on the major surface and having a top surface, said third material body having a height h, with h being approximately equal to t, and with substantially no second semiconductor material disposed on the top surface of the third material body.

3. An article according to claim 1, wherein a given dislocation sink comprises a third material body disposed on the major surface, said third material body having a height h<t, with second semiconductor material overlying the third material body.

4. An article according to claim 1, wherein a given dislocation sink comprises a recessed feature ("trench") in the major surface, with the sink dimension h being the depth of the trench, with h<t, and with second semiconductor material overlying the trench.

5. An article according to claim 1, wherein a given dislocation sink comprises an amorphous substrate region that is essentially planar with the major surface such that the sink dimension h is essentially zero, with second semiconductor material overlying the amorphous substrate region.

6. An article according to claim 1, wherein the first semiconductor is selected from the group consisting of Si, GaAs, InP, and Ge, and the second semiconductor is selected from the group consisting of GaAs, $Ge_xSi_{1-x}$, InP, $In_xGa_{1-x}As$, and $In_xGa_{1-x}As_{1-y}P_y$.

7. An article according to claim 2, wherein the third material body comprises material selected from the group consisting of $SiO_2$ and $Si_3N_x$ (x~4).

8. An article according to claim 3, wherein the third material body comprises material selected from the group consisting of $SiO_2$ and $Si_3N_x$ (x~4).

9. An article according to claim 1, wherein associated with the second semiconductor layer is a critical thickness for misfit dislocation formation $h_c$, and $10h_c<h<t$.

10. An article according to claim 1, wherein the second semiconductor layer comprises a region whose composition varies in the direction normal to the major surface.

11. An article according to claim 10, wherein said region comprises at least two layers of a first composition separated by a layer of a second composition different from the first composition.

12. An article according to claim 11, wherein said region comprises a multiplicity of layers of the second composition.

* * * * *